(12) United States Patent
Hori et al.

(10) Patent No.: US 10,965,268 B2
(45) Date of Patent: Mar. 30, 2021

(54) BONDED BODY OF PIEZOELECTRIC MATERIAL SUBSTRATE AND SUPPORTING SUBSTRATE

(71) Applicant: NGK INSULATORS, LTD., Nagoya (JP)

(72) Inventors: Yuji Hori, Owariasahi (JP); Takahiro Yamadera, Nagoya (JP)

(73) Assignee: NGK INSULATORS, LTD., Nagoya (JP)

( * ) Notice: Subject to any disclaimer, the term of this patent is extended or adjusted under 35 U.S.C. 154(b) by 0 days.

(21) Appl. No.: 17/025,208

(22) Filed: Sep. 18, 2020

(65) Prior Publication Data
US 2021/0006224 A1  Jan. 7, 2021

Related U.S. Application Data

(63) Continuation of application No. PCT/JP2018/044864, filed on Dec. 6, 2018.

(30) Foreign Application Priority Data

Mar. 20, 2018  (JP) .............................. JP2018-052046

(51) Int. Cl.
*H03H 9/25*  (2006.01)
*H03H 9/02*  (2006.01)

(52) U.S. Cl.
CPC .... *H03H 9/02574* (2013.01); *H03H 9/02559* (2013.01); *H03H 9/25* (2013.01)

(58) Field of Classification Search
CPC .. H03H 9/02574; H03H 9/02559; H03H 9/25; H03H 9/02535; H03H 9/02543; H03H 9/02622; H03H 9/02818; H03H 9/02816
See application file for complete search history.

(56) References Cited

U.S. PATENT DOCUMENTS

| | | | |
|---|---|---|---|
| 6,191,002 B1 | 2/2001 | Koyanagi | |
| 6,329,261 B1 | 12/2001 | Kishimoto | |
| 8,729,771 B2 * | 5/2014 | Kobayashi | ............... H03H 3/10 310/313 R |
| 2004/0226162 A1 | 11/2004 | Miura et al. | |

(Continued)

FOREIGN PATENT DOCUMENTS

| | | |
|---|---|---|
| JP | 11307626 A | 11/1999 |
| JP | 200306992 A | 11/2000 |

(Continued)

OTHER PUBLICATIONS

Yoshikaju Zikuhara et al., Sequential Activation Process of oxygen RIE and nitrogen Radical for LiTaO3 and Si Wafer Bonding, ECS Transactions, 3 (6) 91-98 (2006) (9 pages).

(Continued)

*Primary Examiner* — J. San Martin

(74) *Attorney, Agent, or Firm* — Flynn Thiel, P.C.

(57) ABSTRACT

A bonded body includes a supporting substrate, a bonding layer provided on a surface of a supporting substrate and composed of silicon oxide, and a piezoelectric material substrate of a material selected from the group consisting of lithium niobate, lithium tantalate and lithium niobate-lithium tantalate. A convexity is provided on the surface of the supporting substrate, and the bonding layer includes a structural defect part extending above the convexity.

3 Claims, 8 Drawing Sheets

(56) References Cited

U.S. PATENT DOCUMENTS

| | | | |
|---|---|---|---|
| 2018/0175283 A1 | 6/2018 | Akiyama et al. | |
| 2019/0288661 A1 | 9/2019 | Akiyama et al. | |
| 2020/0051720 A1* | 2/2020 | Li | H01F 3/08 |

FOREIGN PATENT DOCUMENTS

| | | |
|---|---|---|
| JP | 3774782 B2 | 12/2004 |
| JP | 2016225537 A | 12/2016 |
| WO | 2017111170 A1 | 6/2017 |
| WO | 2018016314 A1 | 1/2018 |

OTHER PUBLICATIONS

T. Plach et al., Mechanisms for room temperature direct wafer bonding, Journal of Applied Physics 113, 094905 (2013) (8 pages).

International Search Report with English Translation issued in corresponding International Application No. PCT/JP2018/044864 dated Feb. 5, 2019 (5 pages).

Written Opinion of International Searching Authority issued in corresponding International Application No. PCT/JP2018/044864 dated Feb. 5, 2019 (3 pages).

* cited by examiner

BONDED BODY OF PIEZOELECTRIC MATERIAL SUBSTRATE AND SUPPORTING SUBSTRATE

CROSS-REFERENCE TO RELATED APPLICATIONS

This is a continuation of PCT/JP2018/044864, filed Dec. 6, 2018, which claims priority from Japanese Application No. 2018-052046, filed Mar. 20, 2018, the entire contents of which are hereby incorporated by reference.

TECHNICAL FIELD

The present invention relates to a bonded body of a piezoelectric material substrate and supporting substrate.

BACKGROUND ARTS

It has been widely used an SOI substrate composed of a high resistance Si/SiO$_2$ thin film/Si thin film, for realizing a high-performance semiconductor device. Plasma activation is used for realizing the SOI substrate. This is because the bonding can be realized at a relatively low temperature (400° C.). It is proposed a composite substrate composed of similar Si/SiO$_2$ thin film/piezoelectric thin film for improving the characteristics of a piezoelectric device (patent document 1). According to patent document 1, the piezoelectric material substrate composed of lithium niobate or lithium tantalate and silicon substrate with a silicon oxide layer formed thereon are activated by ion activation method, followed by the bonding.

However, there is seldom information relating to bonding technique of realizing the structure of lithium tantalate/silicon oxide/silicon.

Patent document 2 describes that lithium tantalate and sapphire or a ceramic material are bonded through a silicon oxide layer by plasma activation method.

According to non-patent document 1, it is described that lithium tantalate substrate and a silicon substrate with a silicon oxide film provided thereon are bonded with each other by continuously irradiating O$_2$ RIE plasma (13.56 MHz) and microwave (2.45 GHz) of N$_2$.

When Si and SiO$_2$/Si are bonded with each other by plasma activation, a sufficiently high bonding strength is obtained by the formation of Si—O—Si bond at the interface. Further, at the same time, Si is oxidized to SiO$_2$ so that the flatness is improved and the bonding as described above is facilitated at the uppermost surface (Non-patent document 2).

RELATED DOCUMENTS

Non-Patent Documents (Non-Patent Document 1)
ECS Transactions, 3 (6) 91-98 (2006)
(Non-Patent Document 2)
J. Applied Physics 113, 094905 (2013)

Patent Documents (Patent document 1) Japanese Patent Publication No. 2016-225537A
(Patent document 2) Japanese Patent No. 3774782B

SUMMARY OF THE INVENTION

However, as described in the prior documents, in the case that a piezoelectric device is produced by thinning a lithium niobate or lithium tantalate substrate by ion injection, the characteristics is low which is problematic. It is considered that the crystallinity is deteriorated due to the damage during the ion injection.

On the other hand, in the case that a piezoelectric material substrate such as lithium niobate or lithium tantalate is bonded to a silicon oxide layer on a silicon substrate and that the piezoelectric material substrate is then polished to make the substrate thinner, a processing denatured layer can be removed by CMP so that the device characteristics are not deteriorated. However, as the thickness of the piezoelectric material substrate is reduced by polishing, peeling tends to occur at an interface of silicon oxide constituting the bonding layer and supporting substrate, resulting in the reduction of the yield.

An object of the present invention is, in bonding a supporting substrate and a piezoelectric material substrate of a material selected from the group consisting of lithium niobate, lithium tantalate and lithium-niobate-lithium tantalate through a bonding layer of silicon oxide, to suppress the separation at an interface of silicon oxide constituting the bonding layer and supporting substrate.

The present invention provides a bonded body comprising:
a supporting substrate;
a bonding layer provided on a surface of the supporting substrate and comprising silicon oxide; and
a piezoelectric material substrate comprising a material selected from the group consisting of lithium niobate, lithium tantalate and lithium niobate-lithium tantalate,
wherein a concavity is provided on the surface of the supporting substrate and
wherein the bonding layer comprises a structural defect part extending above the concavity.

The inventors tried to improve the adhesion of a supporting body and a bonding layer, for suppressing the generation of minute peeling at an interface of silicon oxide constituting the bonding layer and supporting substrate. For this, as the surface of the supporting substrate was subjected to roughening process, it was not possible to suppress the peeling at the interface of the bonded body only by the roughening.

Thus, the inventors researched the method of processing the surface of the supporting substrate and tried to provide a flat part and a concavity recessed from the flat part on the surface and to form a bonding layer composed of silicon oxide thereon. As a result, it was confirmed that it was generated a structural defect part, having a lower density than the other part of the bonding layer, above the concavity. Silicon oxide matrix is present on both sides of the structural defect part, and silicon oxide is partitioned by the structural defect part. Such structural defect part and silicon oxide matrix on both sides thereof can be confirmed by a transmission type electron microscope (TEM).

According to the bonded body including such microstructure, as a pressure is applied onto the piezoelectric material substrate by polishing or the like, it is found that peeling hardly occurs along the interface between the bonding layer and supporting substrate. Although the reason is not clear, it is speculated that the structural defect part above the concavity has a density slightly lower that a density of the silicon oxide matrix on both sides thereof and that the structural defect part is elastically deformed to absorb the applied load during the polishing of the bonded body to suppress the peeling along the interface.

EMBODIMENTS FOR CARRYING OUT THE INVENTION

Figure 1A:
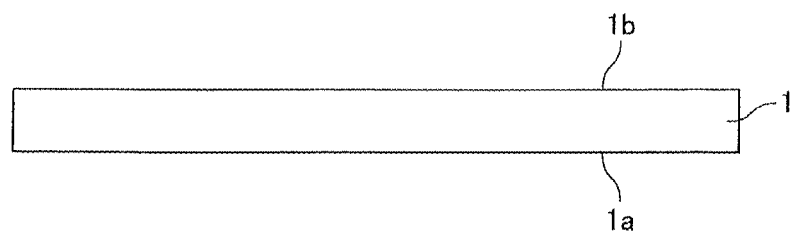
FIG. 1(a) shows a piezoelectric material substrate 1.

The present invention will be described further in detail, appropriately referring to the drawings.

Figure 1B:
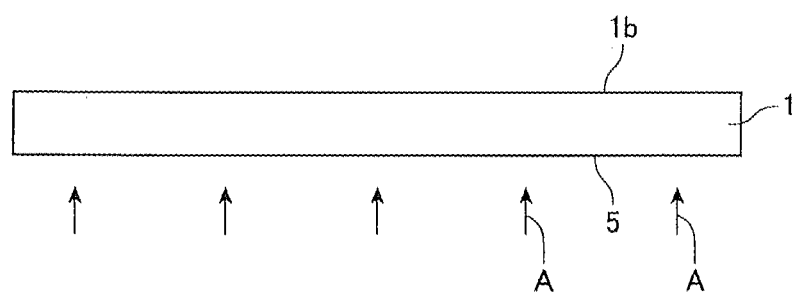
FIG. 1(b) shows the state that plasma A is irradiated onto a bonding surface of the piezoelectric material substrate 1 to generate an activated surface 5.

First, as shown in FIG. 1(a), it is prepared a piezoelectric material substrate 1 having a pair of main surfaces 1a and 1b. Then, as shown in FIG. 1(b), plasma is irradiated onto a bonding surface 1a of the piezoelectric material substrate 1 as arrows A to obtain a surface-activated bonding surface 5.

Figure 2A:
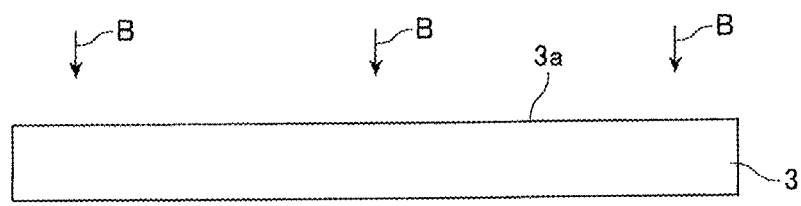
FIG. 2(a) shows the state that processing B is performed on a surface of the supporting substrate 3.
Figure 2B:
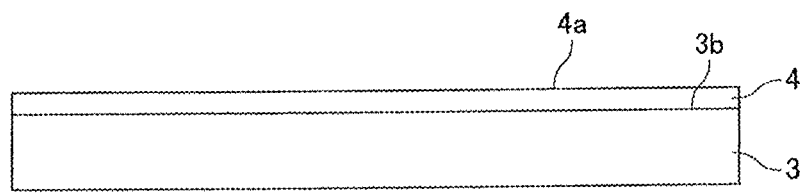
FIG. 2(b) shows the state that a bonding layer 4 is provided on a processed surface 3b of the supporting substrate 3.
Figure 2C:
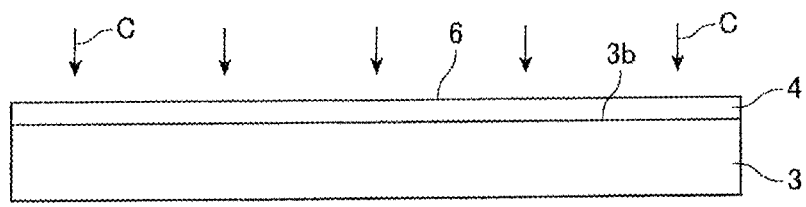
FIG. 2(c) shows the state that plasma C is irradiated onto a bonding surface of the bonding layer 4 to generate an activated surface 6.

On the other hand, as shown in FIG. 2(a), surface processing is performed on a surface 3a of a supporting substrate 3 as an arrow B to form a processed surface 3b as shown in FIG. 2(b). Then, a bonding layer 4 composed of silicon oxide is formed on the surface 3b of the supporting substrate 3. Then, as shown in FIG. 2(c), plasma is irradiated onto a surface 4a of the bonding layer 4 as an arrow C to perform the surface activation to form an activated bonding surface 6.

Figure 3A:
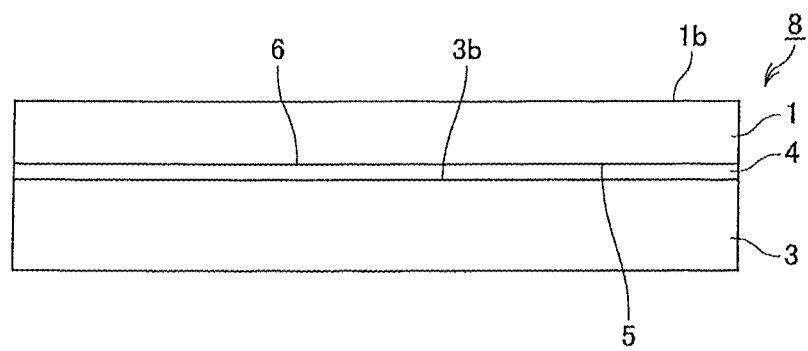
FIG. 3(a) shows a bonded body 8 of the piezoelectric material substrate 1 and supporting substrate 3.

Then, the activated bonding surface 5 on the piezoelectric material substrate 1 and the activated bonding surface 6 of the bonding layer 4 of the supporting substrate 3 can be contacted and directly bonded with each other to obtain a bonded body 8 shown in FIG. 3(a).

Figure 3B:
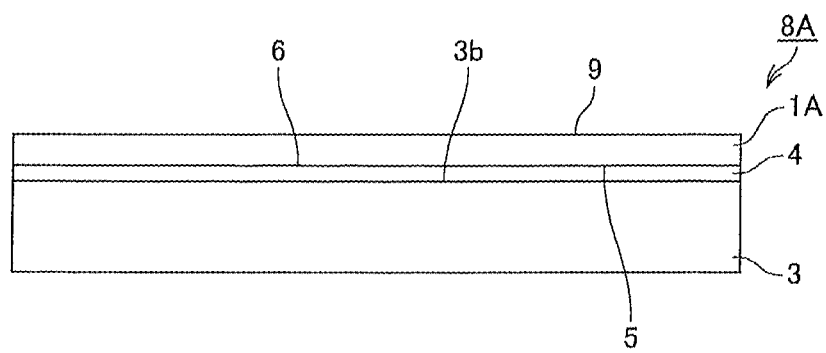
FIG. 3(b) shows the state that the piezoelectric material substrate 1 of a bonded body 8A is thinned by processing.
Figure 3C:
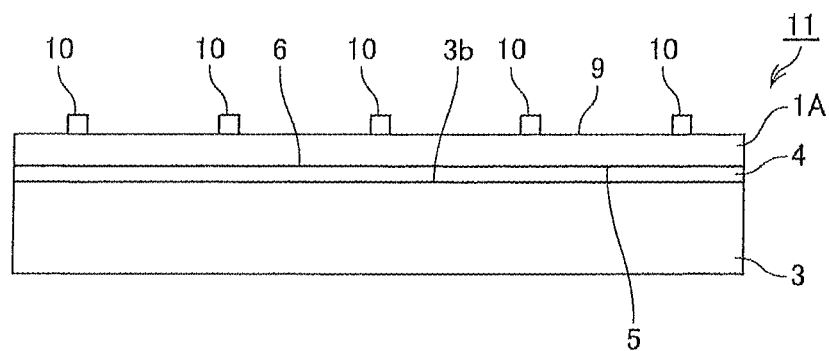
FIG. 3(c) shows an acoustic wave device 11.

An electrode may be provided on the piezoelectric material substrate 1 at this stage. Further, preferably, as shown in FIG. 3(b), the main face 1b of the piezoelectric material substrate 1 is processed to make the substrate 1 thinner, to obtain a bonded body 8A having a thinned piezoelectric material substrate 1A. 9 represents a processed surface. Then, as shown in FIG. 3(c), electrodes 10 may be formed on the processed surface 9 of the piezoelectric material substrate 1A of the bonded body 8A to obtain an acoustic wave device 11.

Figure 4A:
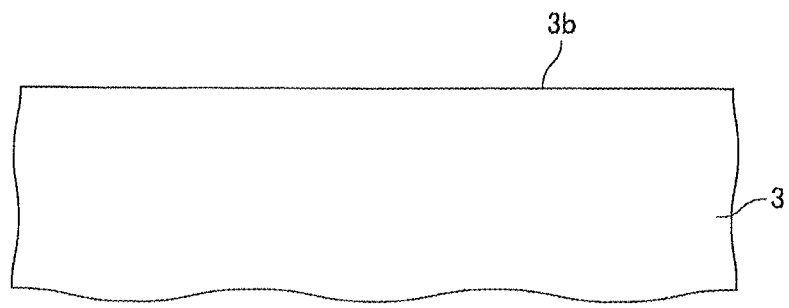
FIG. 4(a) is an enlarged view showing a surface 3a of the supporting substrate 3.
Figure 4B:
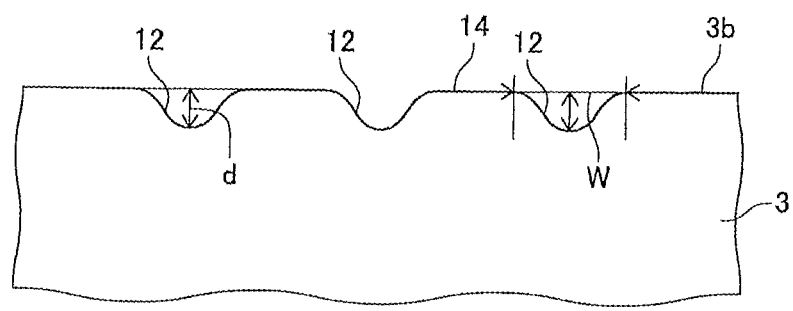
FIG. 4(b) is an enlarged view showing a surface 3b of the supporting substrate after the surface processing.
Figure 4C:
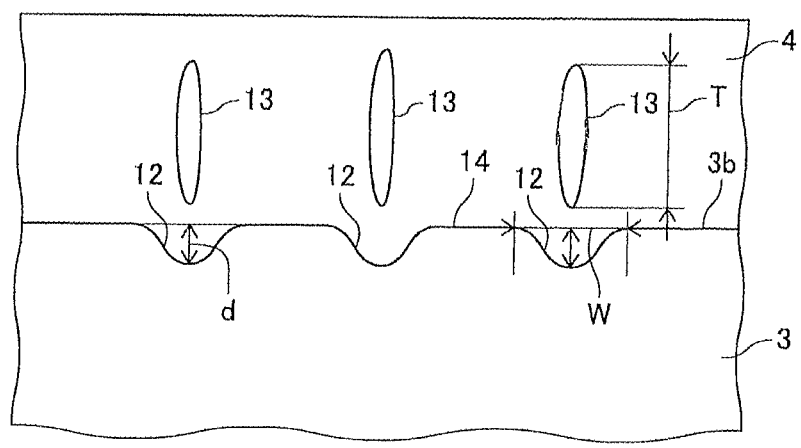
FIG. 4(c) shows the state that a structural defect part 13 provided over the convexity 12.

According to the present invention, a flat surface and concavity are provided on the surface of the supporting substrate, and the bonding layer includes a structural defect part extending above the concavity. For example, according to an example shown in FIGS. 4(a), (b) and (c), the surface 3a of the supporting substrate 3 is processed to form the processed surface 3b. Here, the surface 3b includes a flat surface 14 and concavities 12 recessed from the flat surface 14 toward the inside of the supporting substrate 3 viewed microscopically. Here, the depths of the concavities 12 are controlled and silicon oxide is film-formed on the surface 3b, so that the structural defect parts 13 can be provided in the bonding layer 4 as shown in FIG. 4(c). The respective structural defect parts 13 are formed above the concavities 12, respectively.

Here, the concavity 12 present on the surface 3b means a part recessed from the flat face 14 of the surface toward the inside of the supporting substrate 3. The planar shape of such concavity 12 is not particularly limited and may be a circle, ellipse, polygon or irregular shape.

Further, the depth d of the concavity 12 may preferably be made 80 nm or larger and 250 nm or smaller, on the viewpoint of generating the structural defect part 13 in silicon oxide 4. On the viewpoint, the depth d of the concavity 12 may more preferably be 100 nm or larger and more preferably be 230 nm or smaller.

The width w of the concavity 12 may preferably be 140 nm or larger and 500 nm or smaller, on the viewpoint of generating the structural defect parts 13 in silicon oxide 4.

The bonding layer 4 of the present invention is composed of silicon oxide. Here, the structural defect part 13 means a part which is composed of silicon oxide and has a density lower than a density of silicon oxide matrix constituting the bonding layer 4.

The structural defect part 13 is identified as follows. That is, it is observed using a transmission type electron microscope at an acceleration voltage of 200 kV and at a magnification of 100,000 folds in a visual field of 1.9×2.1 um, while contrast in the visual field is adjusted on an analyzing software.

The structural defect part 13 is provided above the concavity 12 and extends between the concavity 12 and the activated surface 6 of the bonding layer 4. Further, it is not required that the whole of the structural defect part 13 is present above the concavity 13, and it is permitted that a part of the structural part 13 is present above the concavity 12.

According to the present invention, widths or shapes of the respective concavities are not necessarily identical with each other and may be different form each other. Further, it is not required that the structural defect parts 13 are present above all of the concavities 12, respectively, and it is permitted that the structural defect part 13 is present above a part of the concavities 12.

Figure 5:
FIG. 5 is a photograph taken by a transmission type electron microscope (TEM) showing the vicinity of the interface between the surface of the supporting substrate and bonding layer, according to a bonded body of an embodiment of the present invention.
Figure 6:
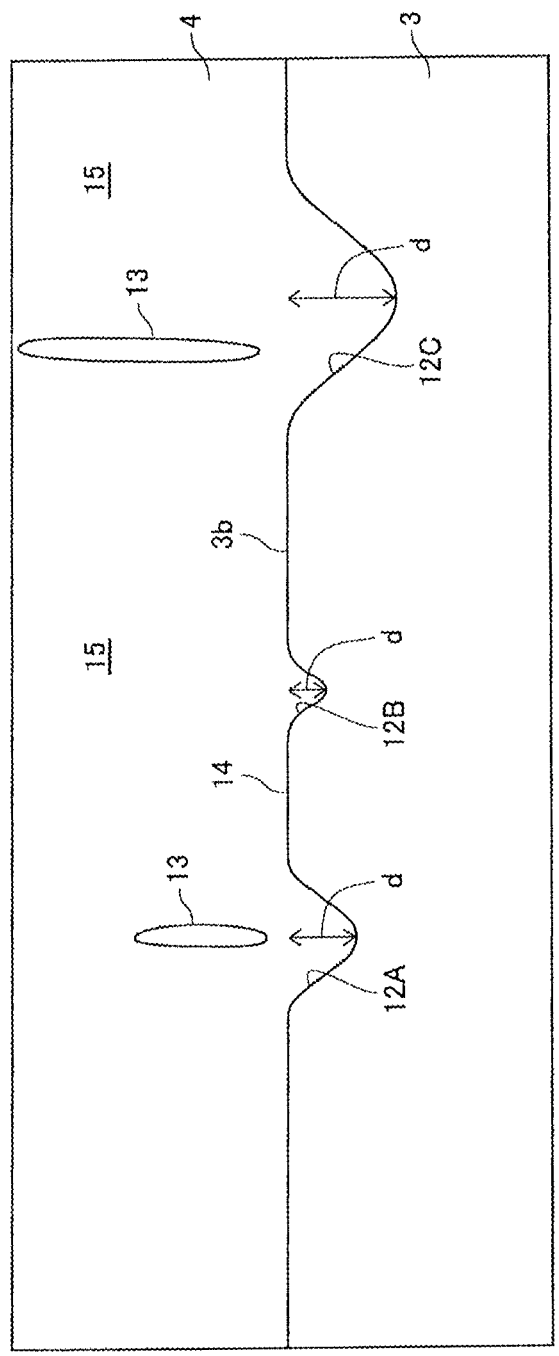
FIG. 6 is a schematic view corresponding with the photograph of FIG. 5.

For example, according to an example shown in FIGS. 5 and 6, concavities 12A, 12B and 12C are provided on the surface 3b of the supporting substrate 3, and the dimensions, particularly depths d, of the respective concavities 12A, 12B and 12C are different from each other. For example, the depth d of the concavity 12A is 110 nm, the depth d of the concavity 12B is 70 nm, and the depth d of the concavity 12C is 190 nm. Then, the structural defect parts 13 are generated above the concavities 12A and 12C, respectively, and the structural defect part 13 is not generated above the concavity 12B.

Figure 7:
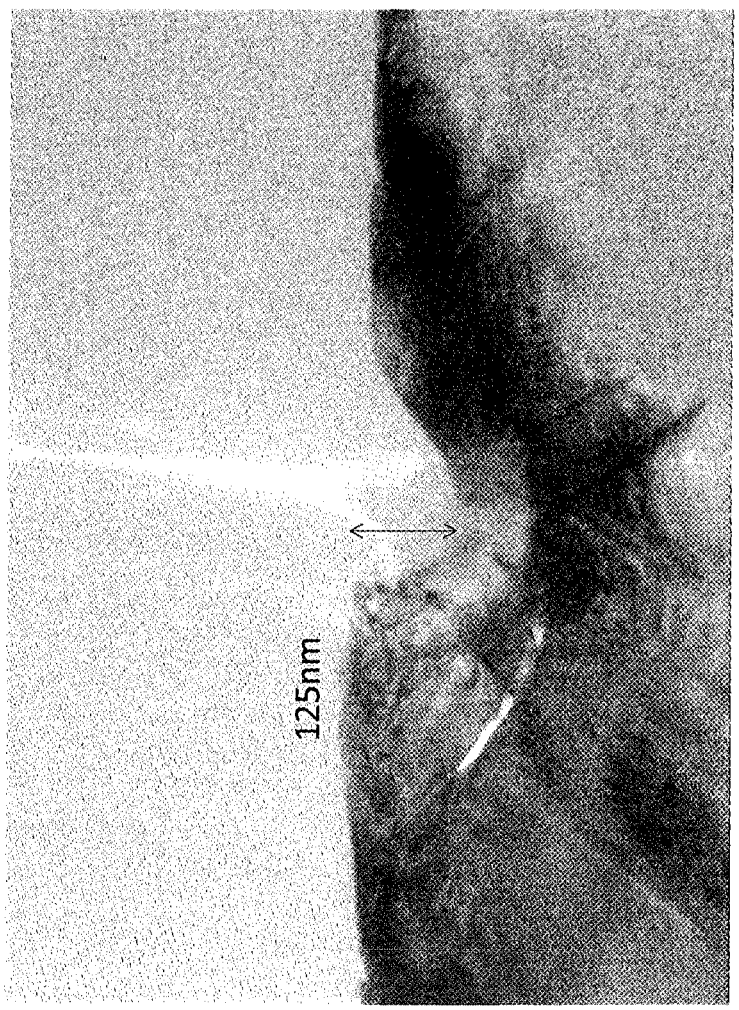
FIG. 7 is an enlarged view of a part of the photograph of FIG. 5.
Figure 8:
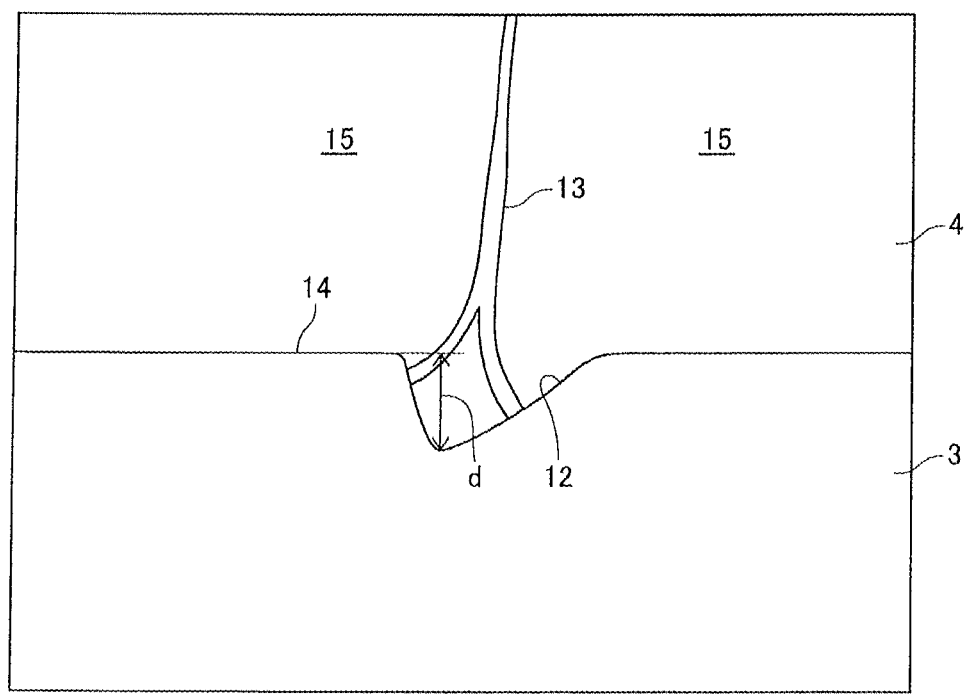
FIG. 8 is a schematic view corresponding with the photograph of FIG. 7.

FIG. 7 is a photograph showing an enlarged view of another concavity 12 and structural defect part 13 above the concavity, and FIG. 8 is a schematic view of FIG. 7. The depth d of the concavity 12 is 125 nm according to the present example. The structural defect part 13 is provided above the concavity 12, and silicon oxide matrix 15 is comparted by the structural defect part 13. The brightness of the silicon oxide matrix 15 is relatively low and the structural defect part 13 is relatively whitish.

As such, the structural defect part 13 is provided over the concavity 12, so that the structural defect part 13 is elastically deformed to absorb the processing load during the polishing of the bonded body 8. It is thus considered that the peeling is suppressed along the interface between the bonding surface 5 of the piezoelectric material substrate 1A and the bonding surface 6 of the bonding layer 4.

The respective constituents of the present invention will be described further in detail below.

Although the material of the supporting substrate 3 is not particularly limited, preferably, the material is selected from the group consisting of silicon, quartz, sialon, mullite, sapphire and translucent alumina. It is thus possible to further improve the temperature characteristics of frequency of the acoustic wave device 11.

When the bonding layer 4 composed of silicon oxide is formed on the supporting substrate 3, the method of film-forming the silicon oxide layer 4 is not particularly limited, sputtering, chemical vapor deposition (CVD) and vapor deposition may be listed.

Here, the concavity 12 is provided on the surface 3b of the supporting substrate 3 to facilitate the generation of the structural defect part 13 above the concavity 12. The method of forming such concavity 12 may preferably be the following.

The concavity 12 can be most easily realized by the surface treatment by mechanical processing. For example, it includes blast processing method of colliding fine particles onto the surface at a high speed and grinding process with fixed abrasives. The blast processing is the most preferred for realizing the present invention, as it is possible to select kind, material and particle size of the particles, and processing time or the like used for the processing so that appropriate processing conditions can be selected among a wide variety of conditions. Further, according to the grinding process, it is selected processing conditions such as the count of the abrasives, rotational rate of a spindle, feed rate or the like so that the adjustment of the conditions can be similarly and easily performed.

On the viewpoint of facilitating the generation of the structural defect parts 13, the thickness of the bonding layer 4 composed of silicon oxide may preferably be 0.05 μm or larger, more preferably be 0.1 μm or larger and most preferably be 0.2 μm or larger. Further, on the viewpoint of the bonding strength, the thickness of the bonding layer 4 may preferably be 3 μm or smaller, more preferably 2.5 μm or smaller and most preferably be 2.0 μm or smaller.

The piezoelectric material substrate 1 used in the present invention is made single crystals of lithium tantalate (LT), lithium niobate (LN) or lithium niobate-lithium tantalate solid solution. As the materials have high propagation speeds of a surface acoustic wave and large electro-mechanical coupling factors, it is preferred for use in a surface acoustic wave device for high frequency and wide-band frequency applications.

Further, the normal direction of the main surface of the piezoelectric material substrate 1 is not particularly limited. For example, in the case that the piezoelectric material substrate 1 is made of LT, it is preferred to use the substrate rotated from Y-axis toward Z-axis by 32 to 55° (180°, 58° to 35°, 180° on Eulerian angle representation) around X-axis, which is a direction of propagation of a surface acoustic wave, because of a low propagation loss. In the case that the piezoelectric material substrate 1 is made of LN, (i) it is preferred to use the substrate rotated from Z-axis toward −Y-axis by 37.8° (0°, 37.8°, 0° on Eulerian angle representation) around X-axis, which is a direction of propagation of a surface acoustic wave, because of a large electro-mechanical coupling factor. Alternatively, (ii) it is preferred to use the substrate rotated from Y-axis toward Z-axis by 40 to 65° (180°, 50 to 25°, 180° on Eulerian angle representation) around X-axis, which is a direction of propagation of a surface acoustic wave, because a high acoustic speed can be obtained. Further, although the size of the piezoelectric material substrate 1 is not particularly limited, for example, the diameter may be 100 to 200 mm and thickness may be 0.15 to Plasma is then irradiated onto the bonding surface 1a of the piezoelectric material substrate 1 and the bonding surface 4a of the silicon oxide film 4 on the supporting substrate 3 at a temperature of 150° C. or lower to activate the bonding surfaces 1a and 4a. Although it is preferred to irradiate nitrogen plasma on the viewpoint of the present invention, the bonded bodies 8 and 8A of the present invention can be obtained even in the case that oxygen plasma is irradiated.

The pressure during the surface activation may preferably be 100 Pa or lower and more preferably be 80 Pa or lower. Further, the atmosphere may be composed of nitrogen only, oxygen only, or mixture of nitrogen and oxygen.

The temperature during the irradiation of the plasma is made 150° C. or lower. It is thereby possible to obtain the bonded bodies 8 and 8A, each having a high bonding strength and no deterioration of the crystallinity. On the viewpoint, the temperature during the plasma irradiation is made 150° C. or lower and may more preferably be 100° C. or lower.

Further, the energy of the irradiated plasma may preferably be 30 to 150 W. Further, a product of the energy of the irradiated plasma and irradiation time duration may preferably be 0.12 to 1.0 Wh.

The bonding surface 5 and bonding surface 6 of the substrates after the plasma treatment are contacted with each other at a room temperature. Although these may be treated under vacuum, the bonding surfaces may preferably be contacted under atmosphere.

According to a preferred embodiment, the bonding surface 1a of the piezoelectric material substrate 1 and the bonding surface 4a of the bonding layer 4 are subjected to flattening process before the plasma treatment. The method of flattening the respective bonding surfaces 1a and 4a includes lapping, chemical mechanical polishing (CMP) and the like. Further, the flattened surface may preferably have Ra of 1 nm or lower and more preferably have Ra of 0.3 nm or lower.

The bonding surface 5 of the piezoelectric material substrate 1 and the bonding surface 6 of the silicon oxide film 4 on the supporting substrate 3 are contacted and bonded with each other. Thereafter, annealing treatment may preferably be performed to improve the bonding strength. The temperature during the annealing treatment may preferably be 100° C. or higher and 300° C. or lower.

The bonded bodies 8 and 8A of the present invention may preferably be applied as an acoustic wave device 11.

As the acoustic wave device 11, a surface acoustic wave device, Lamb wave-type device, thin film resonator (FBAR) or the like is known. For example, the surface acoustic wave device is produced by providing an input side IDT (Inter-digital transducer) electrodes (also referred to as comb electrodes or interdigitated electrodes) for oscillating surface acoustic wave and IDT electrode on the output side for receiving the surface acoustic wave on the surface of the piezoelectric material substrate. By applying high frequency signal on the IDT electrode on the input side, electric field is generated between the electrodes, so that the surface acoustic wave is oscillated and propagated on the piezoelectric material substrate. Then, the propagated surface acoustic wave is drawn as an electrical signal from the IDT electrodes on the output side provided in the direction of the propagation.

A material forming the electrode 10 of the piezoelectric material substrate 1A may preferably be aluminum, an aluminum alloy, copper or gold, and more preferably be aluminum or the aluminum alloy. The aluminum alloy may preferably be Al with 0.3 to 5 weight % of Cu mixed therein. In this case, Ti, Mg, Ni, Mo or Ta may be used instead of Cu.

EXAMPLES

Inventive Example 1

It was produced a bonded body 8A, according to the method described referring to FIGS. 1 to 4.

Specifically, it was prepared a 42Y-cut X-propagation LiTaO$_3$ substrate (piezoelectric material substrate) 1 having a thickness of 200 μm and both main surfaces polished into mirror surfaces, and a high-resistance (>2 kΩ·cm) Si (100) substrate (supporting substrate) 3 having a thickness of 675 μm. Both substrates have sizes of 150 mm, respectively.

Then, the surface 3a of the supporting substrate 3 was subjected to sand blasting. As an agent for the sand blasting, it was used alumina particles of #6000. The alumina particles had an average particle size of 2 um. A wafer was processed by an automated machine while a blast gun was moved in parallel with the wafer so that the whole surface of the wafer was processed. Ra of the surface of the supporting substrate 3 after the processing was proved to be 1.2 nm.

After the surface 3a of the supporting substrate 3 was cleaned, the bonding layer 4 composed of silicon oxide was film-formed by a sputtering system. The thickness of the bonding layer 4 at this time was 540 nm. The surface of the film-formed silicon oxide was subjected to CMP polishing so that Ra of the surface was made 0.3 nm. Then, the bonding surface 1a of the piezoelectric material substrate 1 and bonding layer 4a of the bonding layer 4 on the supporting substrate 3 were cleaned and subjected to surface activation, respectively. Specifically, ultrasonic cleaning using pure water was performed, followed by drying by spin drying of the surfaces of the substrates. Then, the supporting substrate 3 after the cleaning was introduced into a plasma activation chamber, followed by activation of the bonding surface 4a by nitrogen gas plasma at 30° C. Further, the piezoelectric material substrate 1 was similarly introduced into the plasma activation chamber, followed by surface activation of the bonding surface 1a by nitrogen gas plasma at 30° C. The time duration of the surface activation was made 40 seconds, and energy was made 100 W. For the sake of removing particles adhered during the surface activation, the ultrasonic cleaning and spin drying as described above were performed again.

The positions of the respective substrates 1 and 3 were adjusted, and the activated bonding surfaces 5 and 6 of the respective substrates 1 and 3 were contacted with each other at room temperature. The substrates were contacted with the piezoelectric material substrate 1 positioned upper side. As a result, it was observed the state (so called-bonding wave) that the adhesion of the substrates was spreading, indicating that good preliminary bonding was completed. Then, the bonded body was charged into an oven filled with nitrogen atmosphere and held at 150° C. for 10 hours, for improving the bonding strength. The surface 1b of the piezoelectric material substrate 1 of the bonded body 8 after the heating was subjected to grinding, lapping and CMP polishing so that the thickness of the piezoelectric material substrate 1A becomes 1 μm.

Then, the chip of the bonded body after the polishing was charged into an oven, and allowed to stand for 2 hours in an atmosphere at 320° C. As the chip was taken out of the oven, it was confirmed that fracture and peeling were not observed.

Further, the thus obtained chip of the bonded body was cut and the image of the cross section by cutting was taken by a transmission type electron microscope, according to the following conditions. The following results were thus obtained.

Measurement condition: acceleration voltage of 200 kV
System: "H-9500" supplied by Hitachi Hi-Tech Corporation
Magnification: 100,000 folds
Measurement Results:

It was obtained a photograph of the cross section having the shape shown in FIGS. 7 and 8. The specific shape is described below.

Depth d of concavity 12: 125 nm
Width w of concavity 12: 340 nm
Length T of structural defect part 13: 430 nm Inventive Example 2

In the inventive example 1, the surface 3a of the supporting substrate 3 was processed with grinding abrasives of #8000 in a depth of about 2 μm, instead of the sand blasting. The other procedure was made the same as that in the inventive example 1 to produce a chip of the bonded body.

Then, the chip of the bonded body after the polishing was charged into an oven, and allowed to stand for 2 hours in an atmosphere at 320° C. As the chip was taken out of the oven, it was confirmed that fracture and peeling were not observed.

Further, the thus obtained chip of the bonded body was cut and the image of the cross section by cutting was taken by a transmission type electron microscope, according to the following conditions. The following results were thus obtained.

Measurement Results:

It was obtained a photograph of the cross section having the shape shown in FIGS. 5 and 6. The specific shape is described below.

Depth d of concavity 12: 70 to 190 nm
Width w of concavity 12: 90 to 350 nm
Length T of structural defect part 13: 170 to 380 nm
However, the structural defect part 13 was not observed above the concavity 12 having a depth of 70 nm.

Comparative Example 1

The sand blasting of the surface 3a of the supporting substrate 3 was not performed in the inventive example 1. Ra of the surface 3a of the supporting substrate 3 was 0.2 nm. The other procedure was made the same as that in the inventive example 1 to produce the chip of the bonded body.

Then, the chip of the bonded body after the polishing was charged into the oven and allowed to stand at 260° C. for 2 hours. As the chip was taken out of the oven, the peeling occurred along the interface between the bonding surface 5 of the piezoelectric material substrate 1A and bonding surface 6 of the bonding layer 4 and voids were generated.

Further, as the thus obtained chip of the bonded body was cut and the photograph of the cross section by the cutting was taken by a transmission type electron microscope, the structural defect part 13 was not observed.

The invention claimed is:

1. A bonded body comprising:
   a supporting substrate;
   a bonding layer provided on a surface of said supporting substrate and comprising silicon oxide; and
   a piezoelectric material substrate comprising a material selected from the group consisting of lithium niobate, lithium tantalate and lithium niobate-lithium tantalate,
   wherein a concavity is provided on said surface of said supporting substrate; and
   wherein said bonding layer comprises a structural defect part extending above said concavity.

2. The bonded body of claim 1, wherein said concavity has a depth of 80 to 250 nm.

3. The bonded body of claim 1, wherein said piezoelectric material substrate has a thickness of 4.0 µm or smaller.

\* \* \* \* \*